(12) United States Patent
Lee

(10) Patent No.: US 7,442,975 B2
(45) Date of Patent: *Oct. 28, 2008

(54) CMOS IMAGE SENSOR AND METHOD FOR FABRICATING THE SAME

(75) Inventor: Chang Eun Lee, Seoul (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 237 days.

This patent is subject to a terminal disclaimer.

(21) Appl. No.: 11/319,490

(22) Filed: Dec. 29, 2005

(65) Prior Publication Data

US 2006/0145175 A1 Jul. 6, 2006

(30) Foreign Application Priority Data

Dec. 30, 2004 (KR) .................. 10-2004-0117184

(51) Int. Cl.
*H01L 31/113* (2006.01)
*H01L 21/00* (2006.01)
(52) U.S. Cl. ............... 257/292; 257/233; 257/E27.132; 257/E27.133; 438/48; 438/65
(58) Field of Classification Search ................. 257/233, 257/292, 27.132, 27.133, 27.134, E27.132, 257/E27.133, E27.134; 438/48, 65
See application file for complete search history.

(56) References Cited

U.S. PATENT DOCUMENTS

| 6,379,992 B2* | 4/2002 | Jo ................................ 438/70 |
| 2006/0054939 A1* | 3/2006 | Hsu et al. .................... 257/234 |
| 2006/0141660 A1* | 6/2006 | Lee .............................. 438/70 |

FOREIGN PATENT DOCUMENTS

KR 1020040059760 7/2004

* cited by examiner

*Primary Examiner*—Long K Tran
(74) *Attorney, Agent, or Firm*—McKenna Long & Aldridge LLP

(57) ABSTRACT

A CMOS image sensor and a method for fabricating the same prevent a lifting effect of microlenses. Also, a diffused reflection of microlenses is prevented. The CMOS image sensor includes photodiodes, an interlayer insulating layer, metal lines formed in the interlayer insulating layer to electrically connect the respective photodiodes with each other, an oxide layer, a passivation layer to protect the CMOS image sensor from external sources, and microlenses formed to pass through the passivation layer at portions corresponding to the photodiodes.

12 Claims, 5 Drawing Sheets

CMOS IMAGE SENSOR AND METHOD FOR FABRICATING THE SAME

This application claims the benefit of Korean Patent Application No. 10-2004-0117184, filed on Dec. 30, 2004, which is hereby incorporated by reference for all purposes as if fully set forth herein.

BACKGROUND OF THE INVENTION

1. Field of the Invention

The present invention relates to a complementary metal-oxide semiconductor (CMOS) image sensor and a method for fabricating the same, and more particularly, to a CMOS image sensor and a method for fabricating the same in which lifting of the microlenses and diffused reflection of microlenses are prevented.

2. Discussion of the Related Art

Generally, an image sensor is a semiconductor device that converts optical images to electrical signals. The image sensor is classified into a charge coupled device (CCD) and a CMOS image sensor. The CCD stores charge carriers in MOS capacitors and transfers the charge carriers to the MOS capacitors. The MOS capacitors are proximate to one another. The CMOS image sensor employs a switching mode that sequentially detects outputs of unit pixels using MOS transistors by forming the MOS transistors to correspond to the number of the unit pixels using CMOS technology, which uses a control circuit and a signal processing circuit as peripheral circuits.

The CMOS image sensor that converts data of an object into electrical signals includes signal processing chips having photodiodes. Each of the signal processing chips includes an amplifier, an analog-to-digital converter (A/D converter), an internal voltage generator, a timing generator, and a digital logic. The CMOS image sensor is thus economical in view of space, power consumption, and cost. The manufacture of the CCD requires technical and complicated processing steps. However, the CMOS image sensor can be manufactured in mass production by a simple etching process of a silicon wafer cheaper than that of the CCD. Also, the CMOS image sensor has an advantage in its packing density. Thus, the CMOS image sensor is widely used for various application fields such as digital still cameras, smart phones, PDAs, notebook computers, surveillance cameras, bar-code detectors, and toys.

To enhance light sensitivity of the CMOS image sensor, there are efforts to increase a fill factor of an area occupied by a photodiode among the whole area of the image sensor. However, such efforts have limitations because a limited area is needed for a logic circuit for signal processing. Therefore, it is necessary to change a path of incident light to an area other than the photodiode so as to condense the incident light onto the photodiode. To condense the incident light onto the photodiode, a microlens is generally used. The microlens is formed on a nitride layer used as a passivation layer. The nitride layer has poor adhesion to a photoresist, which is used as a main component of the microlens. For this reason, lifting of the microlens is caused. Also, if a metal line of the image sensor is formed in the light path, diffused reflection occurs and deteriorates the quality of the image sensor.

A related art CMOS image sensor will be described with reference to the accompanying drawings.

FIG. 1 is a sectional view illustrating a related art CMOS image sensor.

As shown in FIG. 1, a red photodiode 11 is formed on a semiconductor substrate 10 in which a first epitaxial layer (not shown) is grown. A second epitaxial layer 12 is grown on the first epitaxial layer including the red photodiode 11. A green photodiode 13 is formed in the second epitaxial layer 12, and a third epitaxial layer 14 is grown on the second epitaxial layer 12 including the green photodiode 13. A blue photodiode 15 and a trench are respectively formed in the third epitaxial layer 14. The trench serves to insulate fields from each other. Shallow trench isolations (STI) regions 16 filled with an insulating material are formed.

An interlayer insulating layer 17 is deposited on the third epitaxial layer 14. A first metal layer (not shown) is formed on the interlayer insulating layer 17 and then is patterned to form metal lines 23. The process steps of forming the interlayer insulating layer 17 and the metal lines 23 are repeated several times to deposit a desired number of the metal lines 23. A second metal layer (not shown) is formed on the deposited interlayer insulating layer 17 and then is patterned to form a metal pad 24. A first insulating layer 19 may be formed of an oxide layer on the deposited interlayer insulating layer 17, and a second insulating layer 20 is formed on the first insulating layer 19. The second insulating layer 20 serves as a passivation layer that protects the image sensor from water or physical impact. Subsequently, the first insulating layer 19 and the second insulating layer 20 are selectively etched to open the metal pad 24. A thermal annealing process is then performed. Microlenses 22 are formed on the second insulating layer 20 corresponding to the photodiodes 11, 13 and 15.

The second insulating layer 20 used as the passivation layer may be formed of a nitride layer, and the microlenses 22 may be formed of photoresist. A lifting effect is likely to occur due to poor adhesion between the nitride layer and the photoresist layer. Also, if the metal lines are formed in the path of light, diffused reflection occurs, thereby deteriorating the quality of the image sensor.

The related art CMOS image sensor and the method for fabricating the same have the following problems.

Since the microlenses are primarily formed of photoresist on the nitride layer, a lifting effect may occur due to poor adhesion between the nitride layer and the microlenses. Such a lifting effect of the microlenses causes moving particle to generate poor pixels, thereby reducing yield. Also, since the microlenses are spaced apart from each other, they are easily detached from the nitride layer.

Further, if the metal lines are formed in the path of light, diffused reflection occurs, thereby deteriorating the quality of the image sensor.

SUMMARY OF THE INVENTION

Accordingly, the present invention is directed to a CMOS image sensor and a method for fabricating the same, which substantially obviate one or more problems due to limitations and disadvantages of the related art.

An advantage of the present invention is to provide a CMOS image sensor and a method for fabricating the same in which a nitride layer used as a passivation layer is selectively etched to form microlenses on an oxide layer below the nitride layer, thereby preventing lifting of the microlenses.

Another advantage of the present invention is to provide a CMOS image sensor and a method for fabricating the same in which an anti-diffused reflection layer is formed on a nitride layer to reduce poor pixels and improve quality of the image sensor, thereby improving yield.

Additional features and advantages of the invention will be set forth in the description which follows, and will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described, a CMOS image sensor includes photodiodes formed in a semiconductor substrate, an interlayer insulating layer formed on the semiconductor substrate, metal lines formed in the interlayer insulating layer to electrically connect the respective photodiodes to a logic circuit, an oxide layer formed on the interlayer insulating layer, a passivation layer formed on the oxide layer to protect the CMOS image sensor from external sources, and microlenses formed to pass through the passivation layer at portions corresponding to the photodiodes.

In another aspect of the present invention, a method for fabricating a CMOS image sensor includes forming photodiodes in a semiconductor substrate, forming an interlayer insulating layer on the semiconductor substrate, forming metal lines in the interlayer insulating layer to electrically connect the respective photodiodes with a logic circuit, forming an oxide layer on the interlayer insulating layer, forming a passivation layer on the oxide layer to protect the CMOS image sensor from external sources, and forming microlenses to pass through the passivation layer at portions corresponding to the photodiodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1:
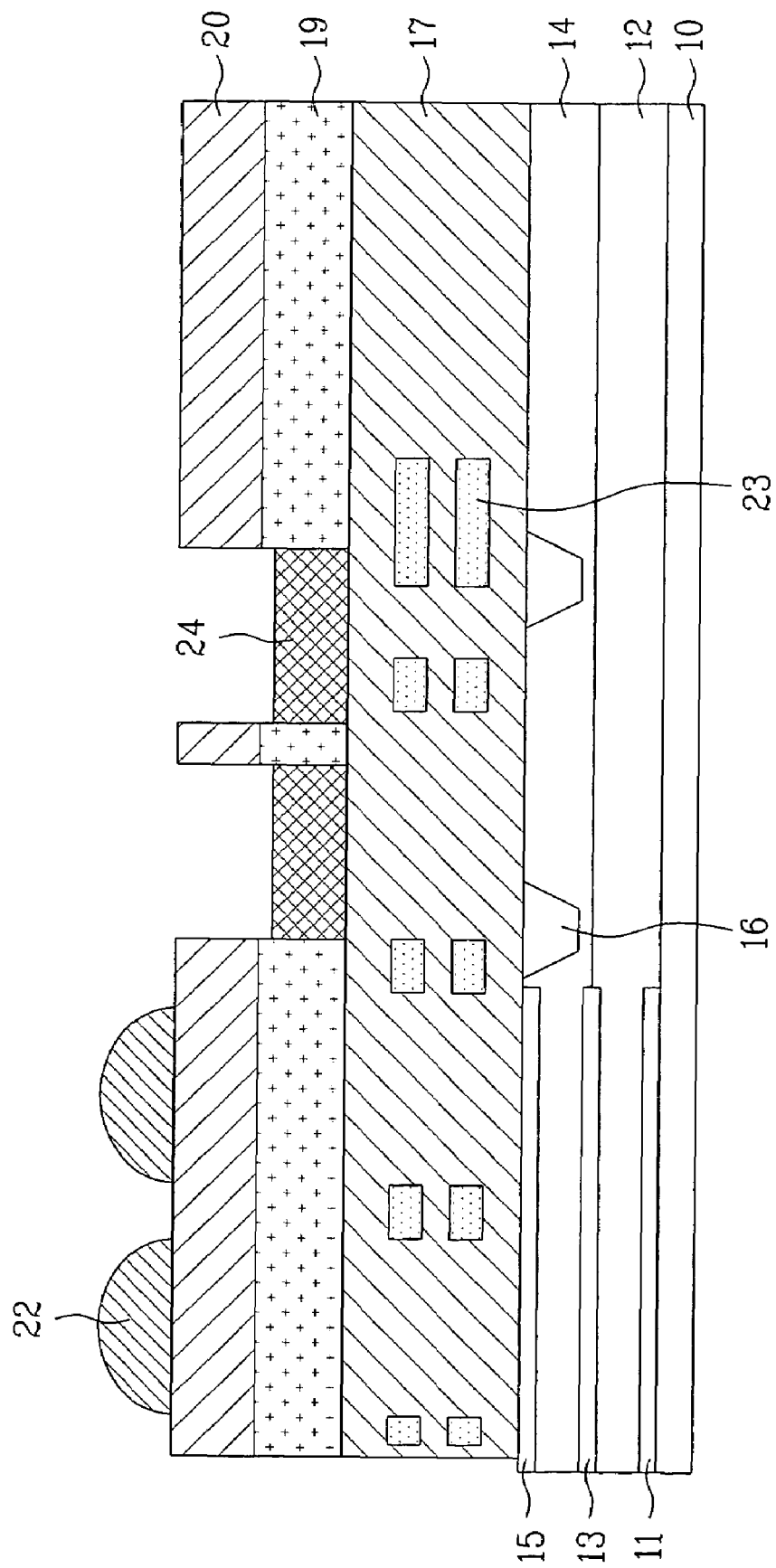
FIG. 1 is a sectional view illustrating a related art CMOS image sensor.
Figure 2A:
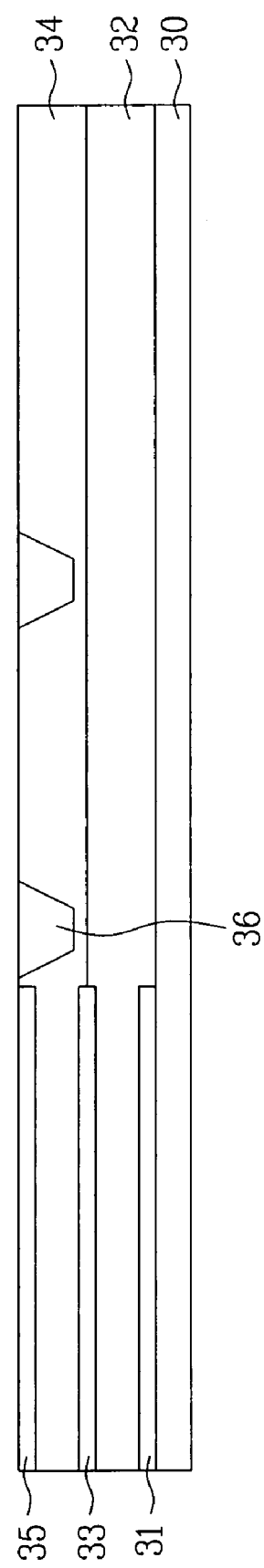
FIGS. 2A-2D are sectional views of a CMOS image sensor fabricated by a method according to an exemplary embodiment of the present invention.

As shown in FIG. 2A, a red photodiode 31 is formed on a semiconductor substrate 30 in which a first epitaxial layer (not shown) is grown. A second epitaxial layer 32 is grown on the semiconductor substrate 30 including the red photodiode 31. A green photodiode 33 is formed in the second epitaxial layer 32, and a third epitaxial layer 34 is grown on the second epitaxial layer 32 including the green photodiode 33. A blue photodiode 35 and a trench are respectively formed in the third epitaxial layer 34. The trench serves to insulate fields from each other. Shallow trench isolation (STI) regions 36 filled with an insulating material are formed.

Figure 2B:
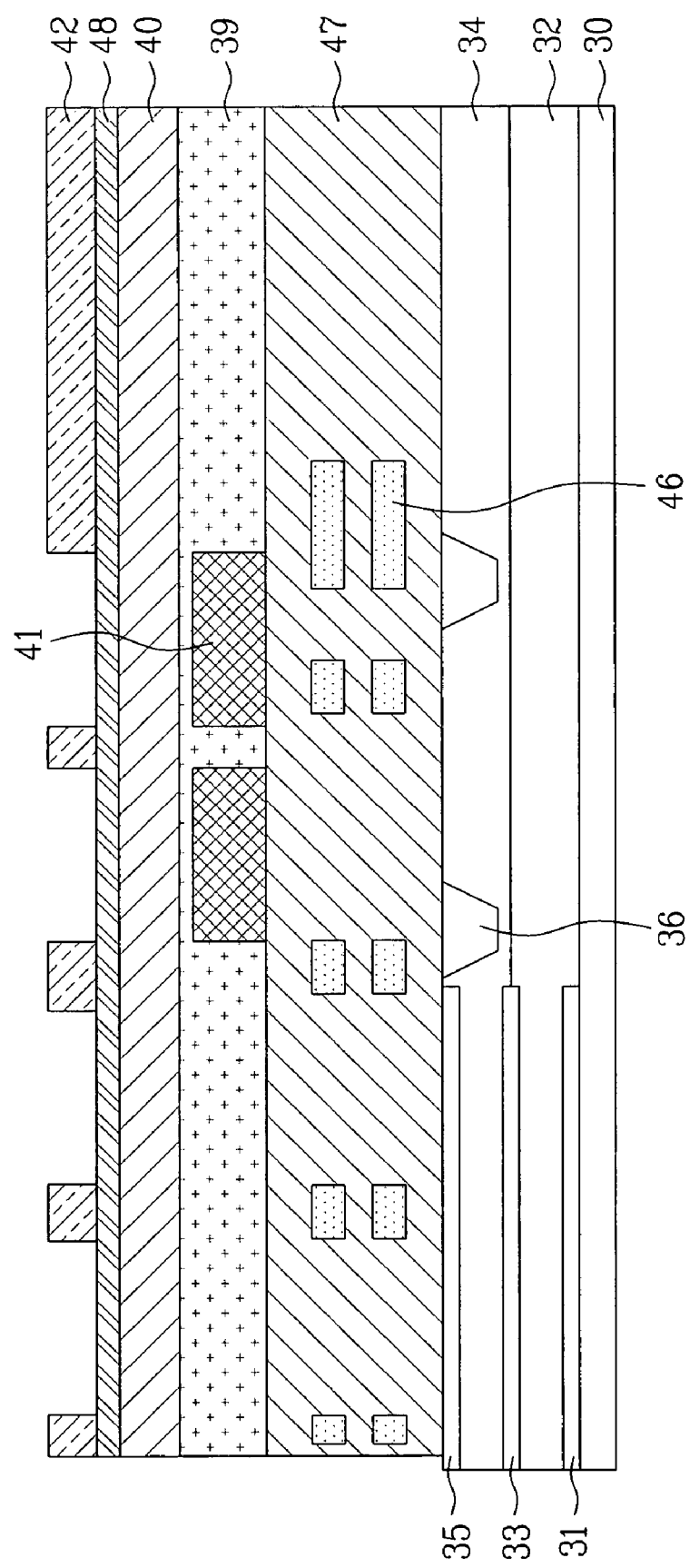

As shown in FIG. 2B, an interlayer insulating layer 47 is deposited on the third epitaxial layer 34. A first metal layer (not shown) is formed on the interlayer insulating layer 47 and then is patterned to form metal lines 46. The process steps of forming the interlayer insulating layer 47 and the metal lines 46 are repeated several times to deposit a desired number of the metal lines 46. A second metal layer (not shown) is formed on the deposited interlayer insulating layer 47 and then is patterned to form metal pads 41. A first insulating layer 39 may be formed of an oxide layer on the deposited interlayer insulating layer 47, and a second insulating layer 40 may be formed of a nitride layer on the first insulating layer 39. The second insulating layer 40 serves as a passivation layer that protects the image sensor from water, physical impact, or other external sources. Subsequently, an opaque layer 48 may be deposited on the second insulating layer 40 to prevent diffused reflection that may occur due to the metal lines 46. A photoresist layer (not shown) is formed on the opaque layer 48 and then selectively removed by exposing and developing processes to form photoresist patterns 42 that open portions for microlenses and portions corresponding to the metal pads 41.

Figure 2C:
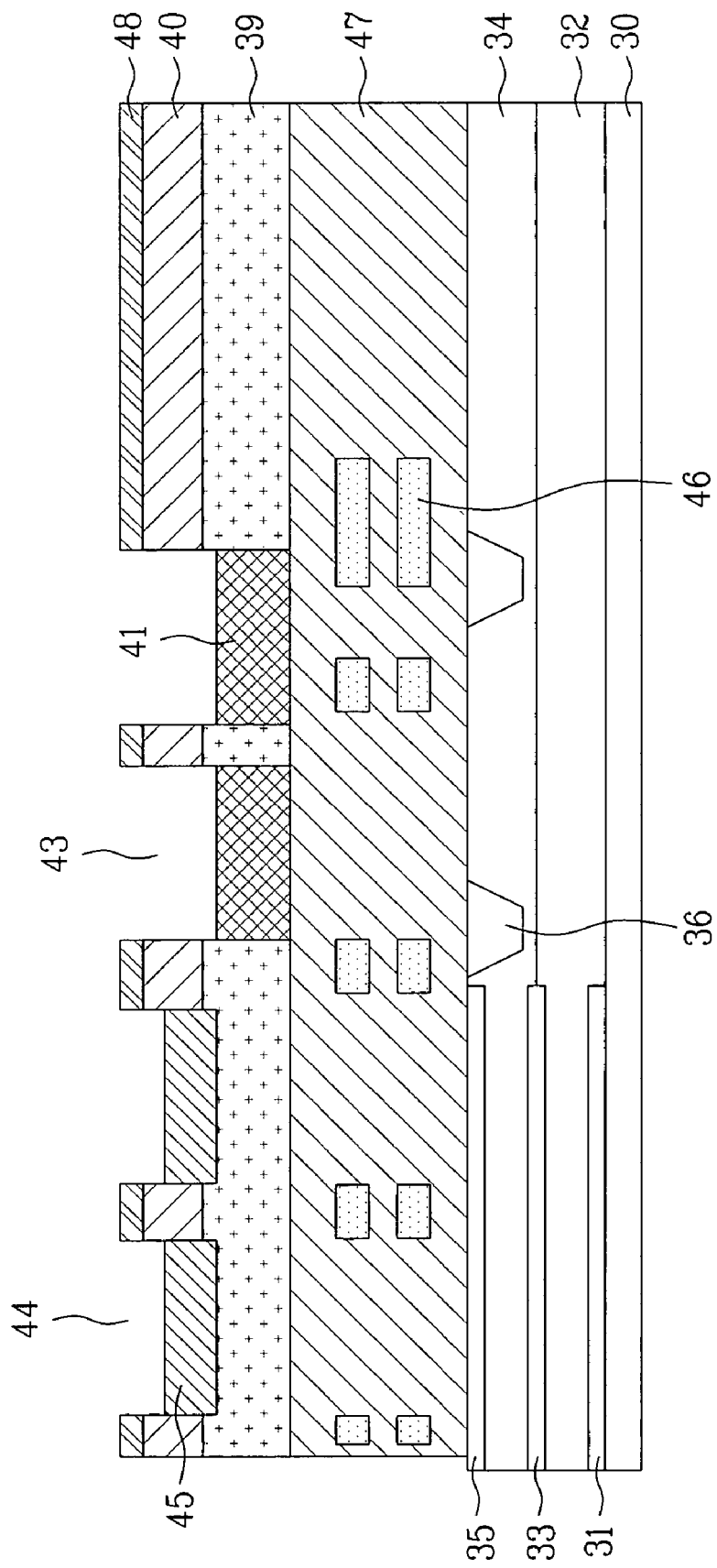

As shown in FIG. 2C, the opaque layer 48, the first insulating layer 39 and the second insulating layer 40 are selectively etched using the photoresist patterns 42 as masks until the metal pads 41 are exposed. Thus, first openings 44 and second openings 43 are respectively formed in the portions for microlenses and the metal pads 41. The first insulating layer 39 is exposed through the first openings 44, and the metal pads 41 are exposed through the second openings 43. After the photoresist patterns 42 are removed, a photoresist layer (not shown) is coated on the opaque layer 48 including the first openings 44 and the second openings 43 and then selectively removed by exposing and developing processes to remain in the first openings 44, so that microlens patterns 45 are formed.

Figure 2D:
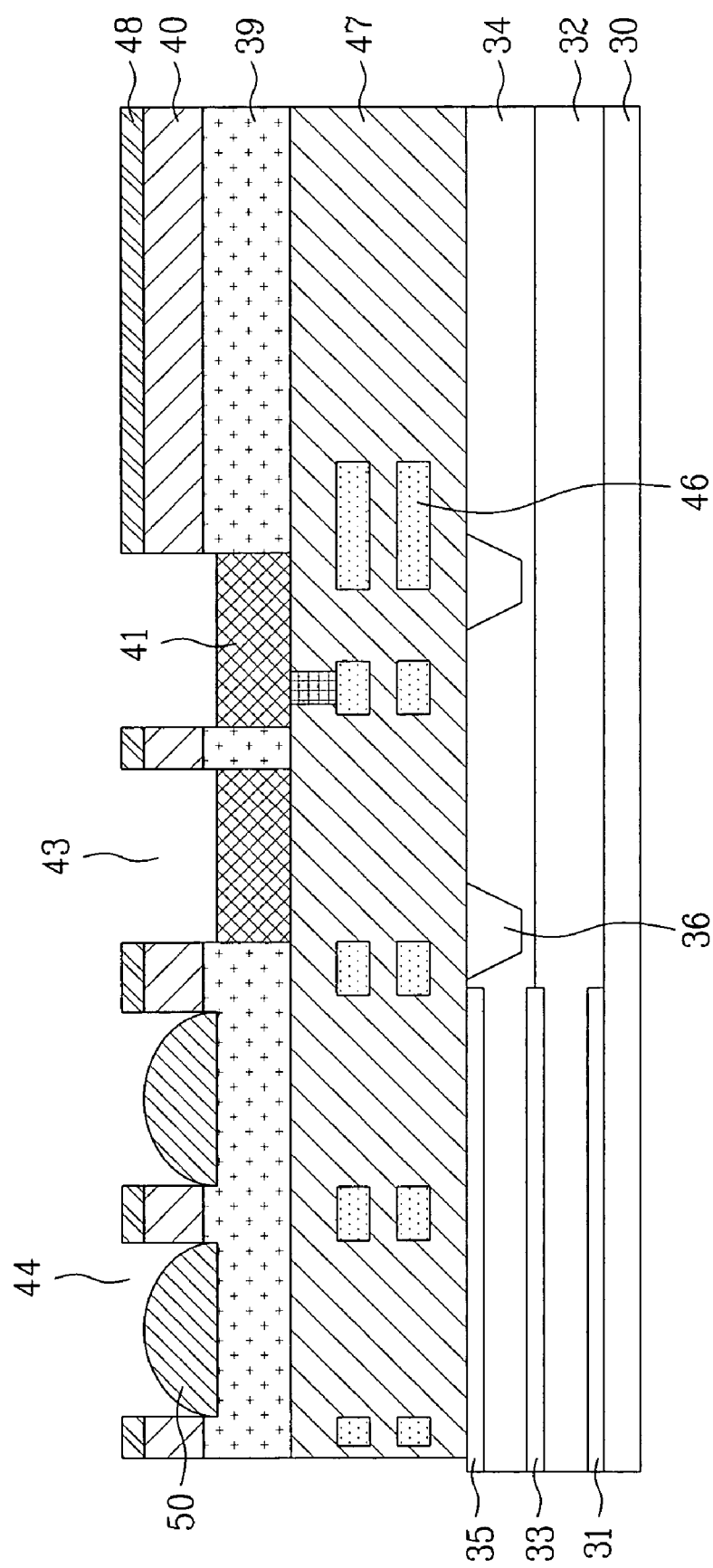

As shown in FIG. 2D, the microlens patterns 45 undergo forming and sintering to form microlenses 50. Portions between the microlenses 50 serve as barriers when patterns for opening the pads 41 are formed.

As described above, the CMOS image sensor and the method for fabricating the same according to the present invention have the following advantages.

The passivation layer, which may be made of nitride, is selectively etched and the microlenses are formed in the etched portions. The microlenses are not formed on the nitride layer but formed on the oxide layer below the nitride layer. Therefore, lifting of the microlenses is prevented, thereby reducing poor pixels and improving yield. Also, since the opaque layer is formed on the nitride layer, it is possible to avoid diffused reflection due to the metal lines, thereby improving quality of the image sensor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A CMOS image sensor comprising:
   photodiodes formed in a semiconductor substrate;
   an interlayer insulating layer formed on the semiconductor substrate;
   metal lines formed in the interlayer insulating layer to electrically connect the respective photodiodes with each other;
   an oxide layer formed on the interlayer insulating layer;
   a passivation layer dividedly formed on the oxide layer; and microlenses formed on the oxide layer below the passivation layer, wherein the microlenses are formed on portions corresponding to the photodiodes.

2. The CMOS image sensor of claim 1, further comprising: an opaque layer formed on the divided passivation layer.

3. The CMOS image sensor of claim 1, wherein the semiconductor substrate includes a first epitaxial layer, a second epitaxial layer formed on the first epitaxial layer, and a third epitaxial layer formed on the second epitaxial layer.

4. The CMOS image sensor of claim 3, wherein the photodiodes include a red photodiode formed in the first epitaxial layer, a green photodiode formed in the second epitaxial layer, and a blue photodiode formed in the third epitaxial layer.

5. The CMOS image sensor of claim 1, wherein the passivation layer is a nitride layer.

6. A method for fabricating a CMOS image sensor comprising:
forming photodiodes in a semiconductor substrate;
forming an interlayer insulating layer on the semiconductor substrate;
forming metal lines in the interlayer insulating layer to electrically connect the respective photodiodes with each other;
forming an oxide layer on the interlayer insulating layer;
forming a passivation layer on the oxide layer;
selectively etching the passivation layer to expose the oxide layer corresponding to the photodiodes; and
forming microlenses on the oxide layer on portions corresponding to the photodiodes.

7. The method of claim 6, further comprising forming an opaque layer on the passivation layer.

8. The method of claim 7, wherein the step of forming the microlenses includes forming open areas by selectively etching the opaque layer and the passivation layer to expose a portion of the oxide layer corresponding to the photodiodes, and forming microlens patterns in the open areas.

9. The method of claim 8, wherein the step of forming the microlens patterns includes coating a photoresist layer on the opaque layer including the open areas, and forming photoresist patterns in the open areas by selectively exposing and developing the photoresist layer.

10. The method of claim 9, further comprising simultaneously forming and sintering processes to form microlenses from the photoresist patterns.

11. The method of claim 6, wherein the step of forming the photodiodes includes forming a first epitaxial layer in the semiconductor substrate, forming a red photodiode in the first epitaxial layer, forming a second epitaxial layer on the first epitaxial layer including the red photodiode, forming a green photodiode in the second epitaxial layer, forming a third epitaxial layer on the second epitaxial layer including the green photodiode, and forming a blue photodiode in the third epitaxial layer.

12. The method of claim 6, wherein the passivation layer is a nitride layer.

* * * * *